United States Patent [19]
Ohashi

[11] Patent Number: 5,986,478
[45] Date of Patent: Nov. 16, 1999

[54] LOGICAL CIRCUIT CAPABLE OF UNIFORMIZING OUTPUT DELAYS FOR DIFFERENT INPUTS

[75] Inventor: Masayuki Ohashi, Tokyo, Japan

[73] Assignee: NEC Corporation, Tokyo, Japan

[21] Appl. No.: 08/886,463

[22] Filed: Jul. 1, 1997

[30] Foreign Application Priority Data

Jul. 1, 1996 [JP] Japan .................................. 8-171185

[51] Int. Cl.⁶ .............................................. H03K 19/0948
[52] U.S. Cl. .......................... 326/104; 326/121; 326/119
[58] Field of Search ................................. 326/104, 112, 326/119–122, 41, 44

[56] References Cited

U.S. PATENT DOCUMENTS

| | | | |
|---|---|---|---|
| 3,986,041 | 10/1976 | Buckley, III et al. | 326/121 |
| 4,716,308 | 12/1987 | Matsuo et al. | 326/121 |
| 5,391,941 | 2/1995 | Landry | 326/106 |
| 5,479,112 | 12/1995 | Choi et al. | 326/34 |

FOREIGN PATENT DOCUMENTS

| | | |
|---|---|---|
| 58-101525 | 6/1983 | Japan . |
| 60-28327 | 2/1985 | Japan . |
| 62-202616 | 7/1987 | Japan . |
| 7-131335 | 5/1995 | Japan . |

*Primary Examiner*—Tuan T. Lam
*Attorney, Agent, or Firm*—Young & Thompson

[57] ABSTRACT

An N-input transistor logic circuit includes two or four series-connected transistor arrays connected between two power lines. The gates of the transistors are connected to the N inputs to account for varying parasitic input capacitances, and equalizes the resulting time delays between the N-inputs and the logical unit output. Specifically, in each of the arrays each of the transistors is connected to one of the N inputs, and is separated from a first power line by X other transistors in the respective array. For each of the input terminals, the sum of X for all the arrays is a constant, namely, 2N–2 for four arrays and N–1 for two arrays.

33 Claims, 8 Drawing Sheets

LOGICAL CIRCUIT CAPABLE OF UNIFORMIZING OUTPUT DELAYS FOR DIFFERENT INPUTS

BACKGROUND OF THE INVENTION

This invention relates to a logical circuit comprising a plurality of transistors connected in series for use in an NAND circuit, an NOR circuit, or the like having a plurality of inputs and, in particular, to a semiconductor integrated circuit arrangement for integrating the logical circuit by the use of a semiconductor.

As an N-input NAND circuit constituted by the use of MOS (metal oxide semiconductor) transistors as MIS (metal insulator semiconductor) transistors, a logical circuit is known which has a logical unit including n-channel MOS transistors, N in number, connected in series or cascade, where N represents an integer greater than one. As an N-input NOR circuit, another logical circuit is known which has another logical unit including p-channel MOS transistors, N in number, connected in series or cascade. In the above-mentioned logical circuits, it is desired to design the circuit so as to avoid occurrence of time lag of outputs for different inputs due to unbalance in input wires (including gates) and gate capacitance and junction capacitance appearing in the output.

A conventional logical circuit of the type is disclosed in Japanese Unexamined Patent Publication (JP-A) No. 202616/1967 (hereinafter called prior art).

In the prior art, a logical unit for switching operation in the NAND circuit (or the NOR circuit) comprises transistor arrays, N or N! in number, connected in parallel, each transistor array comprising n-channel MOS transistors (or p-channel MOS transistors), N in number, connected in series or cascade. The n-channel or the p-channel MOS transistors in the respective arrays are arranged so that their gates are connected in a cyclic fashion.

In the NAND or the NOR circuit of the prior art having the above-mentioned structure, difference in delay time of outputs for different inputs may be eliminated.

However, in the above-mentioned prior art, it is necessary to use a large number of transistors in the logical unit as the number N of the inputs increases. This increases the required art area and complicates the layout of interconnection between the transistors. For example, in case of five inputs (that is, N is equal to 5), the number of transistors used In the logical unit is as enormously large as 5×5 (=N×N) or 5!=5×4×3×2×1 (=N!).

The prior art shows electrical circuit diagrams alone. No description is provided about disadvantages in cases where the circuit shown in the prior art is practically implemented as an integrated circuit. Therefore, when the circuit exemplified in the prior art is straightforwardly integrated, the increase in area is inevitable following the increase in number of required devices.

It is noted here that the increase in area directly results in the increase in chip area. This is a bar against downsizing of a chip. In addition, the increase in number of the devices makes the layout of interconnection lengthy and complicated. This often results in an inbalance in the interconnections.

SUMMARY OF THE INVENTION

It is an object of this invention to provide a logical circuit, such as a NAND circuit and a NOR circuit, which is capable of uniformizing output delays for different inputs by using a reduced number of transistors even when the number of the inputs increases.

It is another object of this invention to provide a semiconductor integrated circuit arrangement adapted to form a logical circuit as an integrated circuit.

It is still another object of this invention to provide a semiconductor integrated circuit arrangement having a layout pattern adapted for the NAND circuit or the NOR circuit.

A logical circuit to which a first aspect of this invention applies comprises first through N-th input terminals (A, B, ... ) supplied with first through N-th input signals, first and second power supply lines (2, 3) supplied with first and second power supply voltages different from each other, and a logical unit connected to the first through the N-th input terminals and to the first and the second power supply lines for carrying out a logical operation on the first through N-th input signals to produce an output signal representative of a result of the logical operation, where N represents an integer greater than one.

According to the first aspect of this invention, the logical unit comprises first through fourth transistor arrays (TA1–TA4), each of which is connected between the first and the second power supply lines.

Each of the first through the fourth transistor arrays is comprised of gated, series-connected metal insulator semiconductor (MIS) type transistors equal in number to the number of input terminals.

To equalize time delays between inputs and outputs caused by parasitic capacitances on the input terminals, each transistor gate in each transistor array of the first through the fourth transistor arrays is connected to any one of the first through the N-th input terminals so that for any input N, the number of the transistors connected between one of the first and the second power supply lines, and the transistors having gates connected to a particular input terminal of the first through the N-th input terminals is equal to the number of the transistors connected between one of the first and the second power supply lines and the transistors having the gates connected to each of the other N input terminals when each of the other N inputs are considered individually.

A logical circuit to which a second aspect of this invention is applicable comprises first through N-th input terminals supplied with first through N-th input signals, first and second power supply lines (2, 3) supplied with first and second power supply voltages different from each other, and a logical unit connected to the first through the N-th input terminals and to the first and the second power supply lines for carrying out a logical operation on the first through N-th input signals to produce an output signal representative of a result of the logical operation, where N represents an integer greater than two.

According to the second aspect of this invention, the logical unit comprises first and second transistor arrays (TA1, TA2), each of which is connected between the first and the second power supply lines.

Each of the first and the second transistor arrays is comprised of gated, series-connected MIS type transistors, equal in number to the number of input terminals.

To equalize time delays between inputs and outputs caused by parasitic capacitances on the input terminals, each transistor gate in each transistor array of the first and the second transistor arrays is connected to any one of the first through N-th input terminals so that for any input N, the number of the transistors connected between one of the first and the second power supply lines, and the transistors having gates connected to a particular input terminal of the first through the N-th input terminals is equal to the number of the transistors connected between one of the first and the second power supply lines and the transistors having the gates connected to each of the other N input terminals when each of the other N inputs are considered individually.

A semiconductor integrated circuit arrangement to which a third aspect of this invention includes first and second transistor arrays (TA1 and TA2) arranged in first and second side regions (11b) of a device region (11) which has a length in a first direction (x), a width in a second direction (y) perpendicular to the first direction, a central region (11a) at a center in the first direction, and the first and the second side regions (11b) at both sides of the central region, each of the first and the second transistor arrays comprising a predetermined number N of transistors connected in series, with each of the transistors being of an MIS (metal insulator semiconductor) type and having a gate.

According to the third aspect of this invention, the semiconductor integrated circuit arrangement comprises:

a central lead (21) connected to an end of each of the first and the second transistor arrays and extended on the central region along the second direction;

first and second side leads (22) connected to different ends of the first and the second transistor arrays, respectively, and extracted from the first and the second side regions, respectively;

a predetermined number N of first gate electrode leads (41) connected to the gates of the transistors of the first transistor array, respectively, and extended on the first side region between the central lead and the first side lead along the second direction; and a predetermined number N of second gate electrode leads (41) connected to the gates of the transistors of the second transistor array, respectively, and extended on the second side region between the central lead and the second side lead along the second direction.

A semiconductor integrated circuit arrangement to which a fourth aspect of this invention includes first and second transistor arrays (TA1 and TA2) arranged in first and second device regions (13 and 14), each of which has a length in a first direction (x), a width in a second direction (y) perpendicular to the first direction, and two endmost regions (13c or 14c) at both ends in the first direction, each of the first and the second transistor arrays comprising a predetermined number N of transistors connected in series, with each of the transistors being of an MIS (metal insulator semiconductor) type and having a gate.

According to the fourth aspect of this invention, the first and the second device regions are arranged along the second direction;

the semiconductor integrated circuit arrangement comprising:

a first power supply line (2) comprising a first lead (23) extracted from one of the endmost regions of the first device region and a second lead (24) extracted from one of the endmost regions of the second device region and located at a side opposite to the first lead in the first direction, the first and the second leads being electrically connected at a position between the first and the second device regions;

a second power supply line (3) comprising a third lead (33) extracted from the other of the endmost regions of the first device region and a fourth lead (34) extracted from the other of the endmost regions of the second device region, the third and the fourth leads being electrically connected so as not to overlap the first power supply line;

a predetermined number N of first gate electrode leads (44) connected to the gates of the transistors of the first gate array, respectively, and extended on the first device region between the first lead (23) and the third lead (33) along the second direction; and a predetermined number of second gate electrode leads (45) connected to the gates of the transistors of the second gate array, respectively, and extended on the second device region between the second lead (24) and the fourth lead (34) along the second direction;

the first lead (23) and the third lead (33) being connected to both ends of the first transistor array (TA1)

the second lead (24) and the fourth lead (34) being connected to both ends of the second transistor array (TA2);

the first gate electrode leads (44) are sequentially numbered one through N, along the first direction from to first lead (23) in the first device region (13) and are connected to correspondingly numbered second gate electrode leads (45), sequentially numbered one through N along the first direction from the fourth lead (34) in the second device region (14) to form gate electrode lead wires (46);

the gate electrode lead wires being arranged so as not to overlap one another.

DESCRIPTION OF THE PREFERRED EMBODIMENTS

Now, description will be made about a logical circuit and a semiconductor integrated circuit arrangement according to this invention in conjunction with various embodiments with reference to the drawings.

Herein, the logical circuit in this invention is a NAND circuit, a NOR circuit, or the like having a plurality of inputs and is characterized by a logical unit comprising transistor arrays each of which includes transistors, equal in number to the inputs, connected in series or cascade.

A logical circuit according to a first embodiment of this invention will hereafter be described with reference to the drawings.

Figure 1:
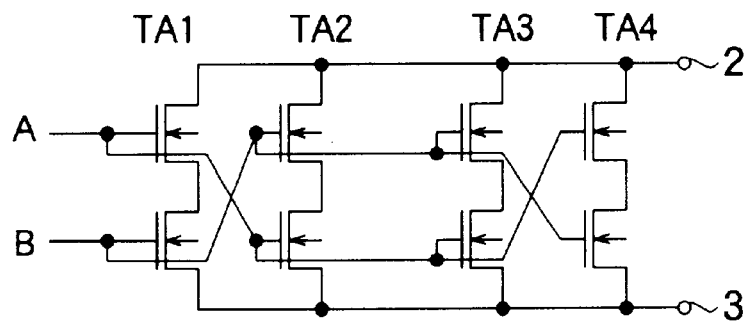
FIG. 1 is a circuit diagram of a logical unit comprising four transistor arrays connected in parallel according to a first embodiment of this invention.

Referring to FIG. 1, a logical unit comprises four transistor arrays TA1 to TA4 connected in parallel and each including transistors equal in number to two inputs A and B.

The logical unit has two power supply lines 2 and 3. As will later be described, each of two power supply lines 2 and 3 is connected to a power supply control portion, a ground control section, a power supply, or ground to execute logical operation as a NAND circuit or a NOR circuit.

In FIG. 1, description will hereafter be made more in detail.

In the following, the leftmost transistor array TA1 in FIG. 1 will be called a first transistor array. The remaining transistor arrays will be successively called second through fourth transistor arrays TA2 to TA4 in the order rightward from the leftmnost transistor array.

In FIG. 1, one of the MOS transistors forming each transistor array which is nearest to the power supply line 2 is called a first transistor. Each of the remaining transistors will be called an N-th transistor in an ascending order towards the power supply line 3.

The first MOS transistor in the first transistor array TA1 has a gate supplied with the input A. The gate of the first MOS transistor in the first transistor array TA1 is connected to a gate of the second MOS transistor in the second transistor array TA2.

The gate of the second MOS transistor in the second transistor array TA2 is connected to a gate of the second MOS transistor in the third transistor array TA3. The gate of the second MOs transistor in the third transistor array TA3 is connected to a gate of the first MOS transistor in the fourth transistor array TA4.

Likewise, the second MOS transistor in the first transistor array TA1 is supplied with the input B and connected to gates of the first MOS transistor, the first MOS transistor, and the second MOS transistor in the second through the fourth transistor arrays TA2 to TA4, respectively.

In the logical circuit having the logical unit of the above-mentioned structure, each transistor of each transistor array of the first through the fourth transistor arrays TA1 to TA4 has the gate which is connected to any one of first and second input terminals A and B so that the number of the transistors connected between one of the first and the second power supply lines 2 and 3 and the transistors having the gates connected to a particular input terminal of the first and second input terminals A and B is equal to the number of the transistors connected between the above-mentioned one of the first and the second power supply lines 2 and 3 and the transistors having the gates connected to each of the first and the second input terminals A and B except the particular input terminal.

With this structure, parasitic capacitances related to the respective input terminals are equal to each other. Therefore, no difference of output delays is caused for different inputs.

Figure 2:
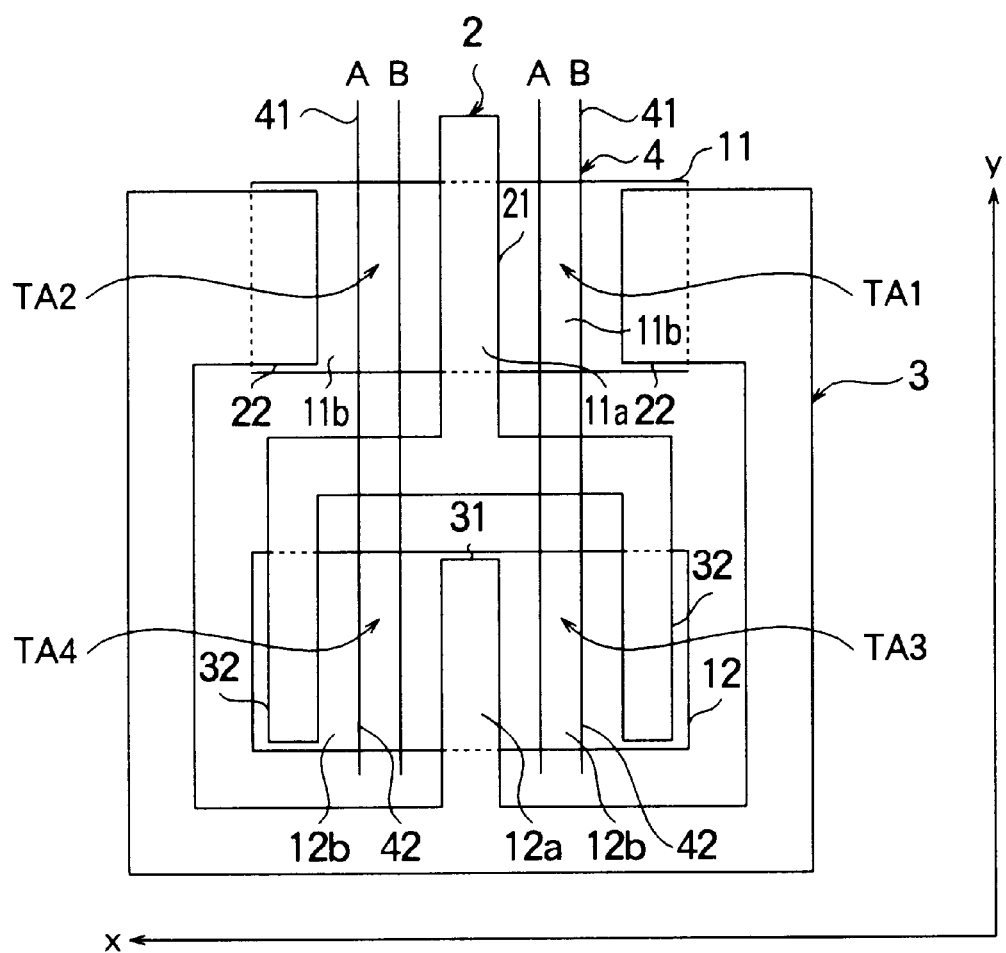
FIG. 2 is a view showing an arrangement upon integrated circuit implementation of the circuit in FIG. 1.

Turning to FIG. 2, description will be made as regards a semiconductor integrated circuit arrangement which is a layout when the above-mentioned logical circuit of FIG. 1 is implemented as a semiconductor integrated circuit.

Referring to FIG. 2, first and second device regions 11 and 12 each of which has a length in a predetermined direction (x in FIG. 2) and a width in a direction (y in FIG. 2) perpendicular to the lengthwise direction are arranged in parallel in the widthwise direction.

The first and the second device regions 11 and 12 have central regions 11a and 12a at the center in the lengthwise direction (x in FIG. 2), respectively. Two side regions 11b and 12b are formed at both sides of the central region 11a and 12a, respectively. The first and the second transistor arrays TA1 and TA2 are arranged in the side regions 11b of the first device region 11. The third and the fourth transistor arrays TA3 and TA4 are arranged in the side regions 12b of the second device region 12.

The first device region 11 is provided with a first lead (central lead) 21 connected to an end of each of the first and the second transistor arrays TA1 and TA2 and extended on the central region 11a along the widthwise direction (y in FIG. 2). Likewise, the second device region 12 is provided with a second lead (central lead) 31 connected to an end of each of the third and the fourth transistor arrays TA3 and TA4 and extended on the central region 12a along the widthwise direction (y in FIG. 2). In addition, the first device region 11 is provided with third leads (side leads) 22 connected to different ends of the first and the second transistor arrays TA1 and TA2 and extracted from the two side regions 11b so that the third leads 22 connect both lengthwise ends of the first device region 11 to each other and so that third leads 22 do not overlap the first and the second leads 21 and 31. The second device region 12 is provided with fourth leads (side leads) 32 connected to different ends of the third and the fourth transistor arrays TA3 and TA4 and extracted from the two side regions 12b so that the fourth leads 32 connect both lengthwise ends of the second device regions 12 to each other and that fourth leads 32 do not overlap the first and the second leads 21 and 31.

In each of the two side regions 11b or 12b of the first or the second device region 11 or 12, a plurality of gate electrode leads 41 or 42 are arranged to be symmetrical with respect to the first or the second lead 21 or 31 and to extend in parallel to the widthwise direction with a predetermined space.

The plurality of the gate electrode leads 41 or 42 are equal in number to the inputs of the logical circuit described above. Specifically, since the logical circuit in this embodiment has two inputs, the gate electrode leads 41 or 42 are equal in number to two in each of the two side regions 11b or 12b or the first or the second device region 11 or 12. Each of the plurality of gate electrode leads 41 or 42 and both sides of each of the plurality of gate electrode leads 41 or 42 in the lengthwise direction form a MOS transistor. As will he understood from the above, the both lengthwise sides of each of the plurality of gate electrode leads 41 and 42 in each of the first and the second device regions 11 and 12 serve as a drain region and a source region. The drain region and/or the source region of each MOS transistor is common to the source region and/or the drain region of each adjacent MOS transistor adjacent to each MOS transistor in the lengthwise direction.

The gate electrode leads 41 in the first device region 11 are connected to the gate electrode leads 42 in the second device region 12, respectively, to form gate electrode leads 4. The gate electrode leads 4 are arranged so as not to overlap each other.

The first lead 21 in the first device region 11 is connected to the fourth leads 32 in the second device region 12 at a position between the first and the second device regions 11 and 12 to form the first power supply line 2.

The third leads 22 in the first device region 11 are connected to the second lead 31 in the second device region 12 without overlapping the first electrode lead 2 to form the second power supply line 3.

Depending upon process conditions, capacitances in the end regions at the right side and the left side of the device region may be unexpectedly different because of the difference in shape or in quantity of ions doped therein. Even in such event, the semiconductor integrated circuit arrangement of the above-mentioned structure has the four side regions so that an output waveform is smoothed to some extent to be substantially constant.

Even if a semiconductor integrated circuit is implemented exactly as designed, the output waveform may be different due to the presence of a heat source. Such problem is likewise solved because the influence of the heat source can be dispersed by provision of the four side regions.

Figure 3:
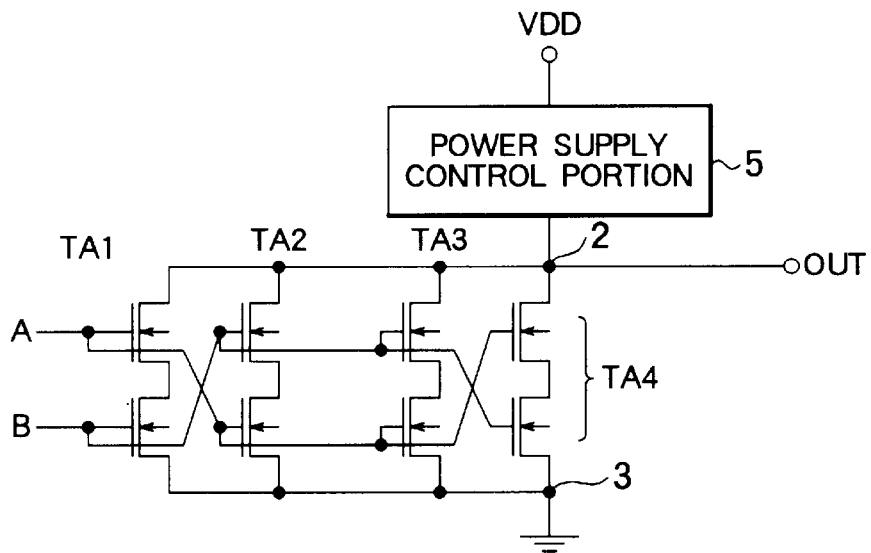
FIG. 3 is a circuit diagram of a NAND circuit to which the logical unit of the first embodiment is applied.

Turning to FIG. 3, the NAND circuit is realized by the use of the semiconductor integrated circuit of FIG. 2 formed by integrating the logical unit comprising the four transistor arrays TA1 to TA4 connected in parallel. As illustrated in FIG. 3, a power supply control portion 5 having a power supply terminal connected to a power supply $V_{DD}$ is connected to one end (for example, the first power supply line 2) of the logical unit comprising the four transistor arrays TA1 to TA4 connected in parallel. The other end (for example, the second power supply line 3) of the circuit comprising the four transistor arrays TA1 to TA4 connected in parallel is connected to the ground.

In this case, the plurality of gate electrode leads 4 are connected in pairs each of which includes one and the other in the two side regions 11b of the first device region 11 (or the two side regions 12b of the second device region 12), respectively. Connection is carried out so that the total number of the other gate electrode leads 4 present between any pair of the gate electrode leads 4 is equal to the total number of the other gate electrode leads 4 present between the other pair of the gate electrode leads 4.

Specifically, the total number of the MOS transistors interposed between any pair of the gate electrode leads 4 and an output terminal (for example, the first power supply line 2) is equal to the total number of the MOS transistors interposed between the other pair of the gate electrode leads 4 and the output terminal (for example, the first power supply line 2).

Each pair of the gate electrode leads 4 thus connected are used as each input terminal in the NAND circuit. A connection point of one end (for example, the first power supply line 2) of the above-mentioned circuit comprising the four transistor arrays connected in parallel, and the power supply control portion 5 is used as the output terminal in the NAND circuit.

In the NAND circuit of the above-mentioned structure, the total number of the MOS transistors interposed between any pair of the gate electrode leads 4 and the output terminal is equal to the total number of the MOS transistors interposed between the other pair of the gate electrode leads 4 and the output terminal. Therefore, with respect to an input to any input terminal, junction capacitance of the MOS transistors involved in an output is constant. As a result, the NAND circuit has a balanced delay characteristic.

Figure 4:
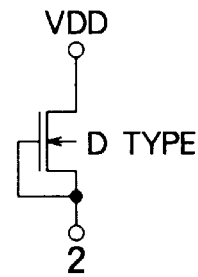
FIG. 4 is a circuit diagram of one example of a power supply control portion in FIG. 3.

As one example, the power supply control portion 5 comprises a single depletion type n-channel MOS transistor, as illustrated in FIG. 4.

In FIG. 4, the n-channel MOS transistor of a depletion type has a gate and a source connected to one end (for example, the first power supply line 2) of the above-mentioned transistor arrays, while a drain is used as the power supply terminal $V_{DD}$. In this case, all of the MOS transistors forming the four transistor arrays are n-channel MOS transistors of an enhanced type.

Figure 5:
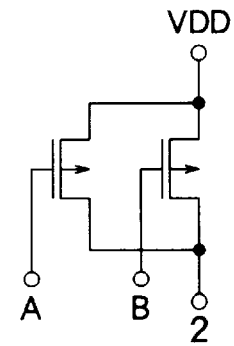
FIG. 5 is a circuit diagram of another example of a power supply control portion in FIG. 3.

As another example, the power supply control portion 5 comprises p-channel MOS transistors equal in number to the n-channel MOS transistors in each transistor array, namely, equal in number to the inputs of the NAND circuit, as illustrated in FIG. 5.

In FIG. 5, the p-channel MOS transistors have sources connected to each other as a power supply terminal $V_{DD}$. The p-channel MOS transistors have drains connected to each other and to one end (for example, the first power supply line 2) of the above-mentioned transistor arrays. The p-channel MOS transistors have gates connected to the gate electrode leads 4 as the inputs of the NAND circuit, respectively.

Next, description will be made regarding the case where the NOR circuit is formed by the use of the semiconductor integrated circuit into which the logical unit comprising the four transistor arrays in this embodiment is integrated.

It is noted here that each of the MOS transistors forming the four transistor arrays is a p-channel MOS transistor.

Figure 6:
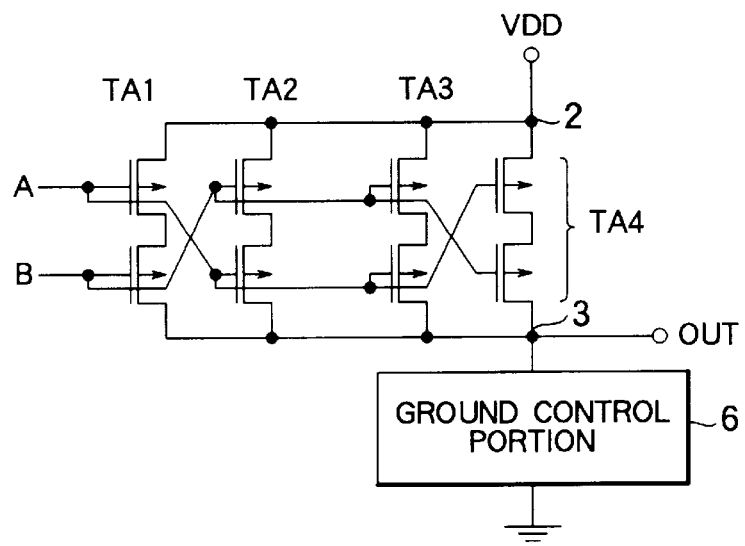
FIG. 6 is a circuit diagram of a NOR circuit to which the logical unit of the first embodiment is applied.

In order to form the NOR circuit by the use of the semiconductor integrated circuit having the semiconductor integrated circuit arrangement of this embodiment, a ground control portion 6 having an earth terminal connected to ground is connected to one end (for example, the second power supply line 3) of the logical unit comprising the four transistor arrays TA1 to TA4 connected in parallel, as illustrated in FIG. 6. The other end (for example, the first power supply line 2) of the logical unit is used as the power supply terminal $V_{DD}$.

A connection point of the one end (for example, the second power supply line 3) of the circuit comprising the four transistor arrays connected in parallel and the ground control portion 6 is used as an output terminal.

In this case, connection of the plurality of gate electrode leads 4 is carried out in the manner similar to the above-mentioned NAND circuit. Specifically, the NOR circuit is formed so that the total number of the MOS transistors interposed between any pair of the gate electrode leads 4 and the output terminal is equal to the total number of the MOS transistors interposed between the other pair of the gate electrode leads 4 and the output terminal.

Figure 7:
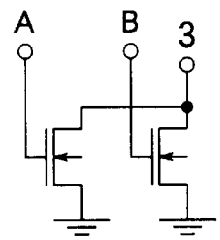
FIG. 7 is a circuit diagram of one example of a ground control portion in FIG. 6.

As one example, the ground control portion 6 comprises n-channel MOS transistors equal in number to the p-channel MOS transistors in each transistor array, namely, equal in number to the inputs of the NOR circuit, as illustrated in FIG. 7. The n-channel MOS transistors have sources connected to each other as an earth terminal. The n-channel MOS transistors have drains connected to each other and to the one end (for example, the second power supply line 3) of the above-mentioned transistor arrays. The n-channel MOS transistors have gates connected to the gate electrode leads 4 as the inputs of the NOR circuit, respectively.

In the first embodiment described above, either of the first and the second power supply lines 2 and 3 can be used as the output terminal when the logical unit comprising the four transistor arrays connected in parallel is applied to the NAND circuit or the NOR circuit.

In the foregoing description, each of the power supply portion 5 and the ground control portion 6 as exemplified is a typical one. Although the arrangement for integration is omitted herein, it is readily possible to integrate the NAND circuit or the NOR circuit by a combination of the typical arrangement of the power supply portion 5 or the ground control portion 6 and the circuit arrangement (comprising four transistor arrays connected in parallel) of this embodiment.

Now, description will be made about a method of forming circuitry of a multi-input (N-input) logical unit in a hierarchical image on the basis of the circuit structure of the above-mentioned logical unit, i.e., the two-input logical unit. By way of example, three-input, four-input, and five-input circuits are described with reference to the drawing.

Figure 8:
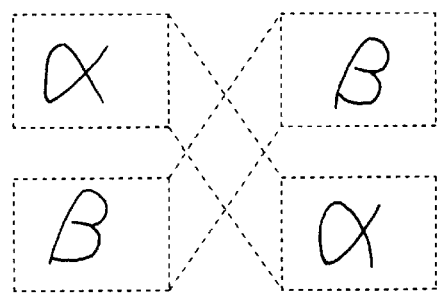
FIG. 8 is a view showing a hierarchical image used in forming a multi-input logical unit according to this invention.

The hierarchical image herein referred to will be described. For example, three inputs can be understood as a combination of a single input and two inputs. In this manner, N inputs are divided into (N−n) inputs and n inputs to form (N−n)-input and n-input logical units. Then, as illustrated in FIG. 8, those logical units are arranged crosswise to form the N-input logical unit.

In the viewpoint of the total parasitic capacitance, such hierarchical image need not be considered. It is simply necessary to form the logical unit so that the total number of the MOS transistors interposed between any pair of the gate electrode leads 4 and the output terminal Is equal to the total number of the MOS transistors interposed between the other pair of the gate electrode leads 4 and the output terminal as described above.

However, if the circuit is formed in the above-mentioned condition alone, the circuit structure becomes complicated and connection error possibly occurs following the increase in number of the inputs.

In this embodiment, it is therefore recommended to implement the circuit structure of the logical unit on the basis of the hierarchical image.

Hereinafter, description will successively be made about the three-input through the five-input logical units with reference to FIGS. 9 through 11.

Figure 9:
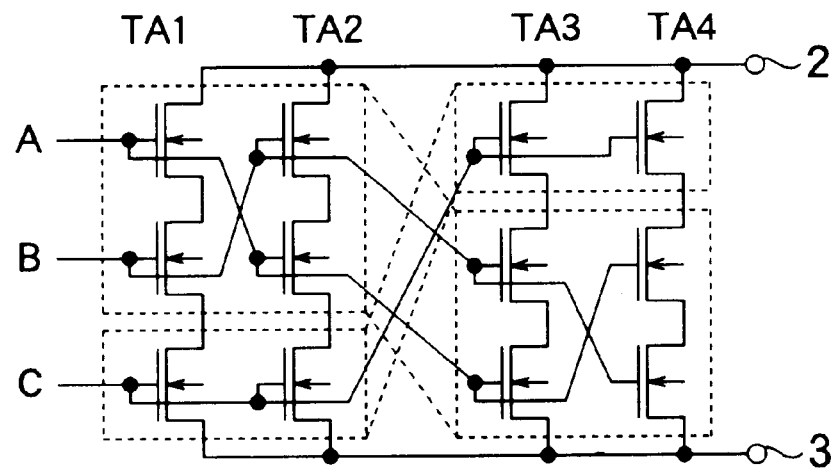
FIG. 9 is a view showing a three-input logical unit according to this invention, which unit is formed by utilizing the hierarchical image in FIG. 8.

At first, the three-input logical unit comprises two-input and single-input logical units arranged crosswise, as illustrated in FIG. 9. In FIG. 9, α and β in FIG. 8 are illustrated as two-input and single-input logical units, respectively, but may be vice versa as will readily be understood.

Figure 10:
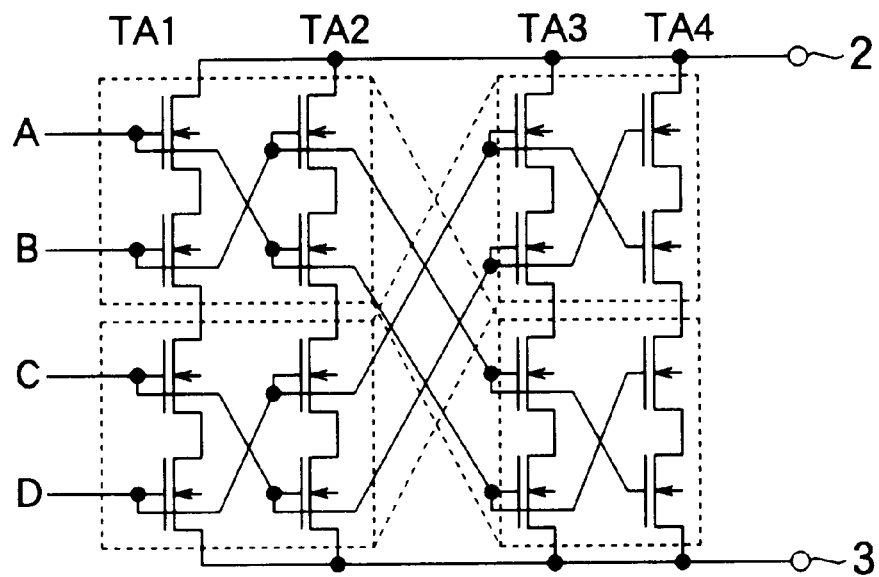
FIG. 10 is a view showing a four-input logical unit according to this invention, which unit is formed by utilizing the hierarchical image in FIG. 8.

Next, the four-input logical unit comprises two two-input logical units arranged crosswise, as illustrated in FIG. 10. Herein, single-input and three-input logical units arranged crosswise be used instead, as will readily be understood.

Figure 11:
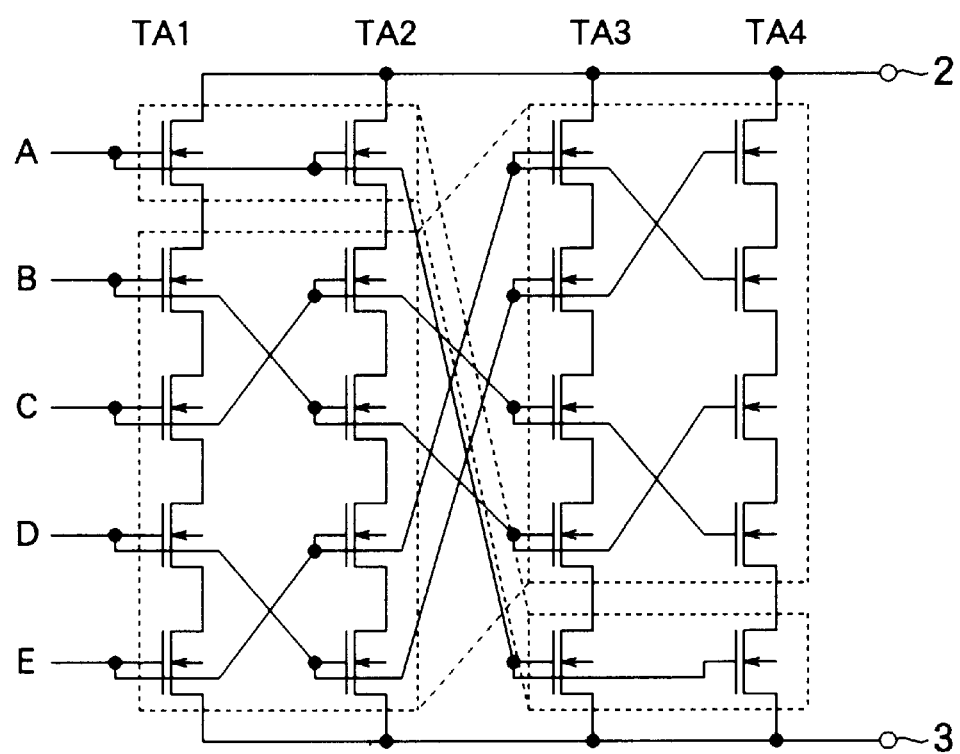
FIG. 11 is a view showing a five-input logical unit according to this invention, which unit is formed by utilizing the hierarchical image in FIG. 8.

Likewise, the five-input logical unit comprises single-input and four-input logical units in crosswise arrangement, as illustrated in FIG. 11. Instead, use may be made of a combination of two-input and three-input logical units, as will readily be understood.

Now, description will be made about a semiconductor integrated circuit arrangement as a layout of a multi-input logical unit of the above-mentioned structure. By way of example, the three-input logical unit will be described.

Figure 12:
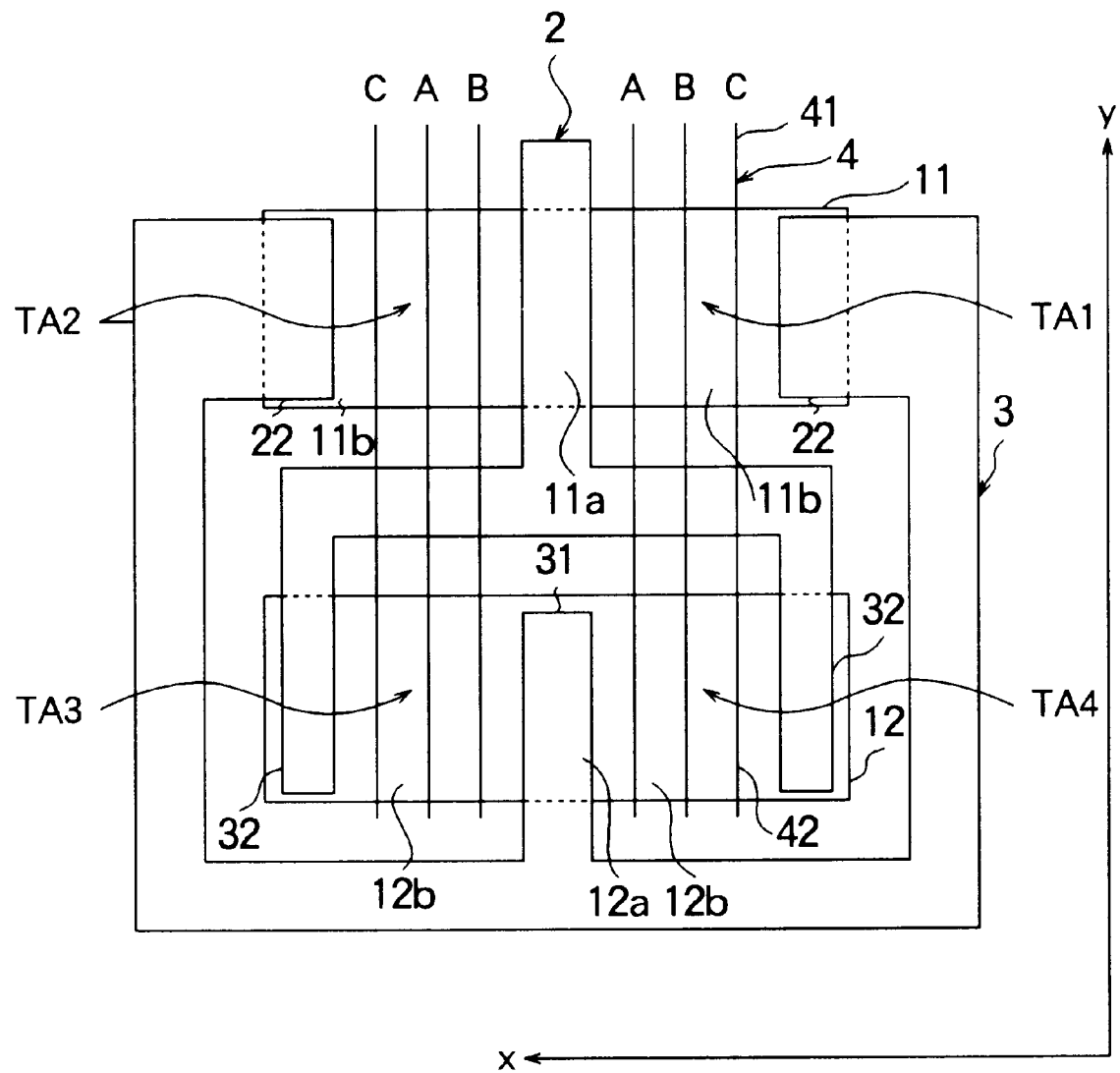
FIG. 12 is a view showing an arrangement upon integrated circuit implementation of the circuit in FIG. 9.

Referring to FIG. 12, the semiconductor integrated circuit arrangement Is exemplified in cases where the three-input logical unit is integrated. In comparison with the semiconductor integrated circuit arrangement related to the two-input logical units illustrated in FIG. 2, the number of the gate electrode leads 4 alone is different, as will readily be understood.

The semiconductor integrated circuit arrangement described in this embodiment is adapted for integration of the N-input logical unit. As will be understood, it is simply necessary to provide the gate electrode leads 4, equal in number to the inputs, in each of the two side regions 11b and 12b of the first and the second device regions 11 and 12.

To help the understanding, the gate electrode leads 4 in the four end regions 11b and 12b correspond to the first through the fourth transistor arrays TA1 to TA4 of the logical unit.

Now, description will be made about a second embodiment of this invention with reference to the drawings.

Figure 13:
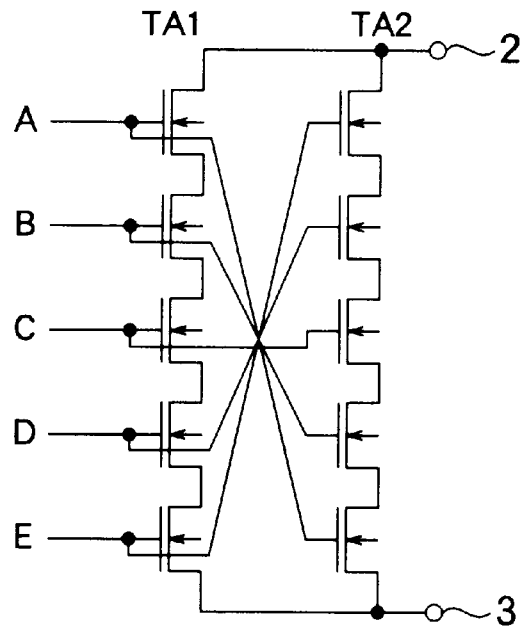
FIG. 13 is a circuit diagram of a logical unit according to a second embodiment of this invention.

A logical circuit in the second embodiment comprises a logical unit having two transistor arrays, as illustrated in FIG. 13.

More specifically, the logical unit comprises two transistor arrays TA1 and TA2 connected in parallel and each comprising five MOS transistors connected in series or cascade and corresponding to inputs A through E, respectively. A gate of the first MOS transistor in the first transistor array is connected to a gate of the first MOS transistor In the second transistor array as counted from a power supply line 3. Likewise, a gate of the second MOS transistor in the first transistor array is connected to a gate of the second MOS transistor in the second transistor array as counted from the power supply line 3. In this manner, a gate of the n-th MOS transistor in the first transistor array is connected to a gate of the n-th MOS transistor in the second transistor array as counted from the power supply terminal 3.

Next, description will be made about two examples of the semiconductor integrated circuit arrangement upon integration of the logical unit of the above-mentioned structure.

Figure 14:
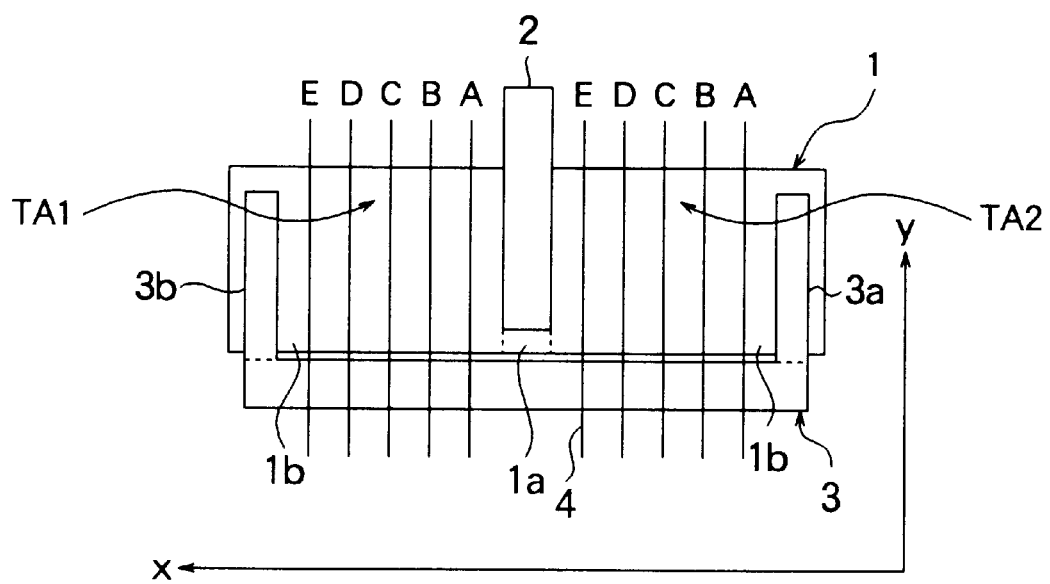
FIG. 14 is a view showing an arrangement upon integrated circuit implementation of the circuit in FIG. 13.

One example has a structure illustrated in FIG. 14.

Specifically, a device region 1 has a length in a predetermined direction (x in FIG. 14) and a width in a direction (y in FIG. 14) perpendicular to the lengthwise direction.

The device region 1 has a central region 1a at the center in the lengthwise direction (x in FIG. 14) and two side regions 1b at both sides of the central region 1a. The first and the second translator arrays TA1 and TA2 are arranged in the two side regions 1b.

On the central region 1a of the device region 1, a first power supply line (central lead) 2 extends in the widthwise direction (y in FIG. 14). From the two side regions 1b of the device region 1, first and second leads 3a and 3b are extracted, respectively. The first and the second leads (side leads) 3a and 3b are connected to each other without overlapping the first power supply line 2 to form a second power supply line 3.

On each of the two side regions, a plurality of gate electrode leads 4 are arranged in a zone between the first electrode lead 2 and each of the first and the second leads 3a and 3b to be symmetrical with respect to the first electrode lead 2 and to extend in parallel to the widthwise direction with a predetermined space.

The plurality of the gate electrode leads 4 are equal in number to the inputs of the logical circuit described above. Each of the plurality of gate electrode leads 4 and both sides of each of the plurality of gate electrode leads 4 in the lengthwise direction form a MOS transistor. As will be understood from the above, both lengthwise sides of each of the plurality of gate electrode leads 4 in the device region 1 serve as a drain region and a source region. The drain region and/or the source region of each MOS transistor is common to the source region and/or the drain region of each adjacent MOS transistor adjacent to each MOS transistor in the lengthwise direction.

Figure 15:
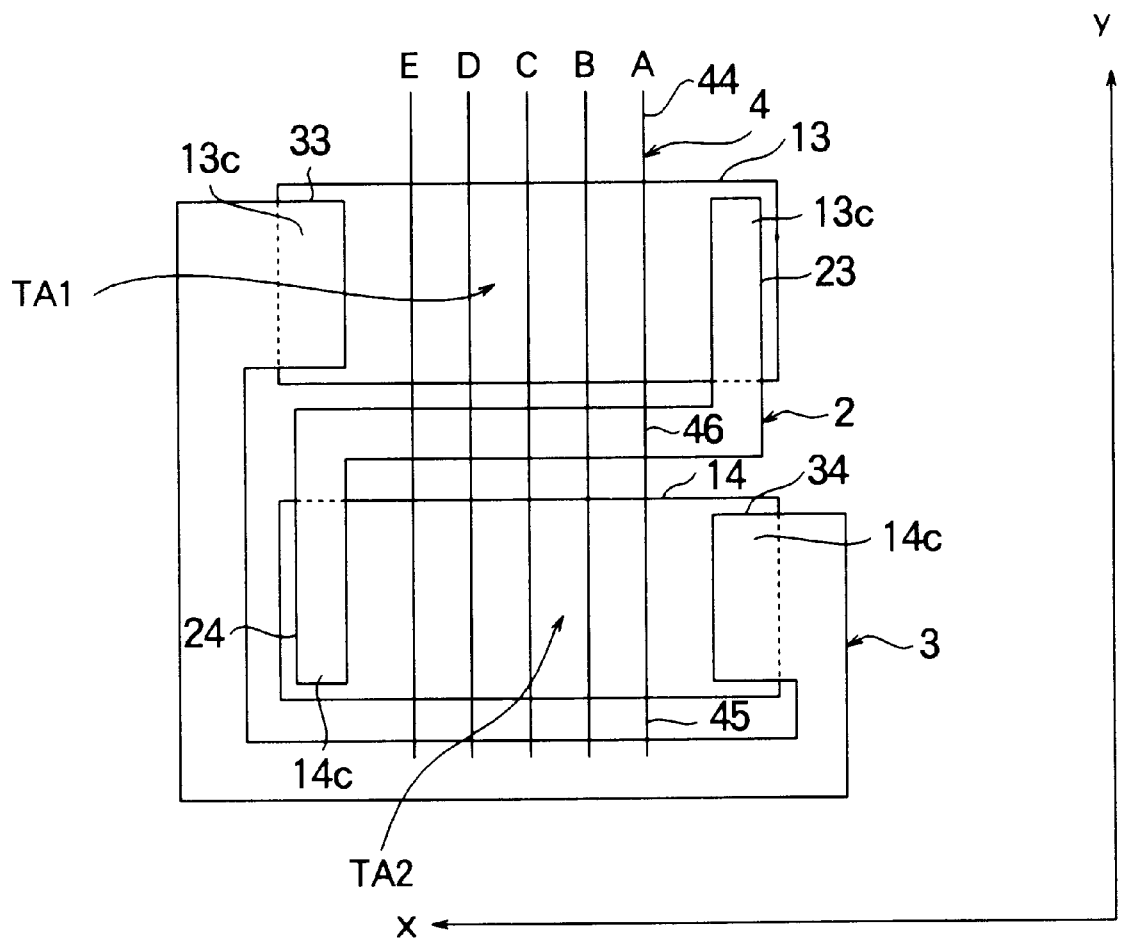
FIG. 15 is a view showing another arrangement upon integrated circuit implementation of the circuit in FIG. 13.

Another example has a structure illustrated in FIG. 15.

Specifically, first and second device regions 13 and 14 each of which has a length in a predetermined direction (x in FIG. 15) and a width in a direction (y in FIG. 15) perpendicular to the lengthwise direction are arranged in parallel in the widthwise direction. The first and the second transistor arrays TA1 and TA2 are arranged in the first and the second device regions 13 and 14.

The first and the second device regions 13 and 14 have two endmost regions 13c and 14c at both lengthwise ends thereof, respectively.

A first lead 23 is extracted from one of the endmost regions 13c of the first device region 13. A second lead 24 is extracted from one of the endmost regions 14c of the second device region 14 and is located opposite to the first lead 23 in the lengthwise direction. The first and the second leads are electrically connected at a position between the first and the second device regions 13 and 14 to form a first power supply line 2.

A third lead 33 extracted from the other of the endmost regions 13c of the first device region 13 and a fourth lead 34 extracted from the other of the endmost regions 14c of the second device region 14 are electrically connected to form a second power supply line 3 without overlapping the first power supply line 2.

In each zone between the two endmost regions 13c or 14c on the first or the second device region 13 or 14, respectively, a plurality of gate electrode-leads 44 or 45 extend In parallel to the widthwise direction with a predetermined spacing.

The plurality of the gate electrode leads 44 or 45 are equal In number to the inputs of the logical circuit described above. Each of the plurality of gate electrode leads 44 and 45 and both sides of each of the plurality of gate electrode leads 44 and 45 in the lengthwise direction form a MOS transistor. As will be understood from the above, the both lengthwise sides of each of the plurality of gate electrode leads 44 and 45 in the first and the second device regions 13 and 14 serve as a drain region and a source region. The drain region and/or the source region of each MOS transistor is common to the source region and/or the drain region of each adjacent MOS transistor adjacent to each MOS transistor in the lengthwise direction.

The gate electrode leads 44 in the first device region 13 are connected to the gate electrode leads 45 in the second device region 14, respectively, to form gate electrode leads 4 The gate electrode leads 4 are arranged so as not to overlap one another.

The logical circuit comprising the logical unit having the above-mentioned semiconductor integrated circuit arrangement advantageously has a less number of elements but is readily affected by the problem inherent to the semiconductor integrated circuit as described in conjunction with the first embodiment.

The principle of removing the difference in output for each input and the structure of the NAND circuit or the NOR circuit are similar to those described in conjunction with the first embodiment.

Although the description is directed to the five inputs alone, it will readily be understood that this embodiment is also applicable to any other multiple inputs, such as three inputs and four inputs.

As described above, according to this invention, there is provided a logical circuit, such as a NAND circuit and a NOR circuit, which is capable of uniformizing output delays for different inputs by using a reduced number of transistors even when the number of the inputs increases.

According to this invention, there is also provided a semiconductor Integrated circuit arrangement adapted to form the logical circuit as an integrated circuit.

What is claimed is:

1. A semiconductor integrated circuit arrangement including first and second transistor arrays (TA1 and TA2) arranged, respectively in first and second side regions (11b) of a device region (11) which has a length in a first direction (x), a width in a second direction (y) perpendicular to said first direction, a central region (11a) at a center in said first direction, and said first and said second side regions (11b) at both sides of said central region, each of said first and said second transistor arrays comprising a predetermined number of transistors connected in series, each of said transistors being of an MIS (metal insulator semiconductor) type and having a gate, wherein said semiconductor integrated circuit arrangement comprises:

a central lead (21) connected to an end of each of said first and said second transistor arrays and extended on said central region along said second direction;

first and second side leads (22) connected to different ends of said first and said second transistor arrays, respectively, and extracted from said first and said second side regions, respectively;

a predetermined number of first gate electrode leads (41) connected to the gates of the transistors of said first transistor array, respectively, and extended on said first side region between said central lead and said first side lead along said second direction; and a predetermined number of second gate electrode leads (41) connected to the gates of the transistors of said second transistor array, respectively, and extended on said second side region between said central lead and said second side lead along said second direction.

2. A semiconductor integrated circuit arrangement as claimed in claim 1, wherein:

said device region has a plurality of diffusion regions forming drain and source regions of the transistors of said first and said second transistor arrays;

one of said diffusion regions being shared by two of the transistors that are located at both sides of said central lead.

3. A semiconductor integrated circuit arrangement as claimed in claim 1, wherein:

said device region has a plurality of diffusion regions forming drain and source regions of the transistors of said first and said second transistor arrays;

each of said diffusion regions being shared by two of the transistors of said first and said second transistor arrays, said two of the transistors of said first and said second transistor arrays having the gate electrode leads which are adjacent to each other.

4. A semiconductor integrated circuit arrangement as claimed in claim 1, wherein:

said central lead forms a first power supply line (2);

said first and said second side leads being connected to each other without overlapping said first power supply line to form a second power supply line (3).

5. A semiconductor integrated circuit arrangement as claimed in claim 4, wherein said semiconductor integrated circuit further comprises:

a power supply portion connected to one of said first and said second power supply lines and having a power supply terminal connected to a power supply (VDD) for supplying a power-supply voltage from said power supply to said one of the first and the second power supply lines;

N input terminals where N is an integer greater than one, for being supplied with first through N-th input signals; and an output terminal connected to said one of the first and the second power supply lines;

a different one of said first and said second power supply lines being connected to the ground;

wherein the predetermined number of transistors in each of said first and said second transistor arrays is equal to N;

wherein each transistor of each transistor array of said first and said second transistor arrays has the gate electrode lead connected to a respective one of said N input terminals so that for each of said first and second transistor arrays, the one of said transistors to which the respective input terminal is connected is separated from said one of the first and second power supply lines by x of the other transistors in the respective array, and wherein for each of said N input terminals, the total of x for said first and second transistor arrays is the same.

6. A semiconductor integrated circuit arrangement as claimed in claim 5, wherein:

each transistor of said first and said second transistor arrays is of an n-channel MIS type and of an enhanced type;

said power supply portion comprising an n-channel MIS transistor of a depletion type;

said n-channel MIS transistor of a depletion type having a gate and a source which are connected to said one of the first and the second power supply lines in common;

said n-channel MIS transistor of a depletion type having a drain which is connected to said power supply terminal.

7. A semiconductor integrated circuit arrangement as claimed in claim 5, wherein:

each transistor of said first and said second transistor arrays is of an n-channel MIS type;

said power supply portion comprising p-channel MIS transistors equal in number to the gate electrode leads of the transistors of each of said first and second transistor arrays;

said p-channel MIS transistors having sources connected to said power supply terminal in common;

said p-channel MIS transistors having drains connected to said one of the first and the second power supply lines in common;

said p-channel MIS transistors having gates connected to the gate electrode leads of each of said first and said second transistor arrays, respectively.

8. A semiconductor integrated circuit arrangement as claimed in claim 4, wherein said semiconductor integrated circuit further comprises:

a ground control portion connected to one of said first and said second power supply lines and having an earth terminal connected to the ground for controlling connection of said one of the first and the second power supply lines to said earth terminal;

N input terminals, where N is an integer greater than one, for being supplied with first through N-th input signals; and an output terminal connected to said one of the first and the second power supply lines;

a different one of said first and said second power supply lines being connected to a power supply (VDD);

wherein the predetermined number of transistors in each of said first and said second transistor arrays is equal to N;

wherein each transistor of each transistor array of said first and said second transistor arrays has the gate electrode lead connected to a respective one of said N input terminals so that for each of said first and second transistor arrays, the one of said transistors to which the respective input terminal is connected is separated from said one of the first and second power supply lines by x of the other transistors in the respective array, and wherein for each of said N input terminals, the total of x for said first and second transistor arrays is the same.

9. A semiconductor integrated circuit arrangement as claimed in claim 8, wherein:

each transistor of said first and said second transistor arrays is of a p-channel MIS type;

said ground control portion comprising n-channel MIS transistors equal in number to the gate electrode leads of the transistors of each of said first and said second transistor arrays;

said n-channel MIS transistors having sources connected to said earth terminal in common;

said n-channel MIS transistors having drains connected to said one of the first and the second power supply lines in common;

said n-channel MIS transistors having gates connected to the gate electrode leads of each of said first and said second transistor arrays, respectively.

10. A semiconductor integrated circuit arrangement as claimed in claim 1, said semiconductor integrated circuit further including third and fourth transistor arrays (TA3 and TA4) arranged in first and second additional side regions (12b) of an additional device region (12) which has a length in said first direction, a width in said second direction, an additional central region (12a) at a center in said first direction, and said first and said second additional side regions (12b) at both sides of said additional central region, each of said third and said fourth transistor arrays comprising a predetermined number of transistors connected in series, each of the transistors of said third and said fourth transistor arrays being of an MIS (metal insulator semiconductor) type and having a gate, wherein said semiconductor integrated circuit arrangement further comprises:

an additional central lead (31) connected to an end of each of said third and said fourth transistor arrays and extended on said additional central region along said second direction;

first and second additional side leads (32) connected to different ends of said third and said fourth transistor arrays, respectively, and extracted from said first and said second additional side regions, respectively;

a prescribed number of first additional gate electrode leads (42) connected to the gates of the transistors of said third transistor array, respectively, and extended on said first additional side region between said additional central lead and said first additional side lead along said second direction; and a prescribed number of second additional gate electrode leads (42) connected to the gates of the transistors of said fourth transistor array, respectively, and extended on said second additional side region between said additional central lead and said second additional side lead along said second direction;

said prescribed number being equal to said predetermined number.

11. A semiconductor integrated circuit arrangement as claimed in claim 10, wherein:

said additional device region has a plurality of additional diffusion regions forming drain and source regions of the transistors of said third and said fourth transistor arrays;

one of said additional diffusion regions being shared by two of said transistors of said third transistor array located on a first side of said additional central lead (31) along said first direction within said additional device region (12), and one of said additional diffusion regions being shared by two of said transistors of said fourth transistor array located on a second side of said central lead (31) along said first direction within said additional device region (12).

12. A semiconductor integrated circuit arrangement as claimed in claim 10, wherein:

said additional device region has a plurality of additional diffusion regions forming drain and source regions of the transistors of said third and said fourth transistor arrays;

each of said additional diffusion regions being shared by two of the transistors of said third and said fourth transistor arrays, said two of the transistors of said third and said fourth transistor arrays having the additional gate electrode leads which are adjacent to each other.

13. A semiconductor integrated circuit arrangement as claimed in claim 10, wherein:

each of said first and second additional side leads is connected to said central lead to form said first power supply line (2);

said additional central lead being connected to said said first and said second side leads without overlapping said first power supply line to form said second power supply line (3).

14. A semiconductor integrated circuit arrangement as claimed in claim 13, wherein:

the first additional gate electrode leads (42) adjacent to and parallel to said additional central lead (31) in said additional device region (12), and sequentially numbered one through N along said first direction from said additional central lead to one of said first and second additional side leads (32), where N is an integer greater than one, are connected to corresponding N numbered first gate electrode leads (41), adjacent to and parallel to said central lead (21) in said device region (11), and sequentially numbered one through N along said first direction from said central lead to form first gate electrode lead wires;

the second additional gate electrode leads (42) adjacent to and parallel to said additional central lead (31) in said additional device region (12), and sequentially numbered one through N along said first direction from said additional central lead to one of said first and second additional side leads (32), are connected to corresponding numbered second gate electrode leads (41) adjacent to and parallel to said central lead (21) in said device region (11), and sequentially numbered one through N along said first direction from said central lead to form second gate electrode lead wires;

said first and said second gate electrode lead wires being arranged so as not to overlap one another.

15. A semiconductor integrated circuit arrangement as claimed in claim 14, wherein said semiconductor integrated circuit further comprises:

a power supply portion connected to one of said first and said second power supply lines and having a power supply terminal connected to a power supply (VDD) for supplying a power-supply voltage from said power supply to said one of the first and the second power supply lines;

N input terminals for being supplied with first through N-th input signals; and an output terminal connected to said one of the first and the second power supply lines;

a different one of said first and said second power supply lines being connected to the ground;

wherein the predetermined number of transistors in each of said first through said fourth transistor arrays is equal to N;

wherein each transistor of each transistor array of said first through said fourth transistor arrays connected to a respective one of said N input terminals so that for each of said first through fourth transistor arrays, the one of said transistors to which the respective input terminal is connected is separated from said one of the first and second power supply lines by x of the other transistors in the respective array, and wherein for each of said N input terminals the total of x for said first through fourth transistor arrays is the same.

16. A semiconductor integrated circuit arrangement as claimed in claim 15, wherein:

each transistor of said first through said fourth transistor arrays is of an n-channel MIS type and of an enhanced type;

said power supply portion comprising an n-channel MIS transistor of a depletion type;

said n-channel MIS transistor of a depletion type having a gate and a source which are connected to said one of the first and the second power supply lines in common;

said n-channel MIS transistor of a depletion type having a drain which is connected to said power supply terminal.

17. A semiconductor integrated circuit arrangement as claimed in claim 15, wherein:

each transistor of said first through said fourth transistor arrays is of an n-channel MIS type;

said power supply portion comprising p-channel MIS transistors equal in number to the gate electrode lead wires of the transistors of each of said first through said fourth transistor arrays;

said p-channel MIS transistors having sources connected to said power supply terminal in common;

said p-channel MIS transistors having drains connected to said one of the first and the second power supply lines in common;

said p-channel MIS transistors having gates connected to the gate electrode lead wires of each of said first through said fourth transistor arrays, respectively.

18. A semiconductor integrated circuit arrangement as claimed in claim 14, wherein said semiconductor integrated circuit further comprises:

a ground central portion connected to one of said first and said second power supply lines and having an earth terminal connected to the ground for controlling connection of said one of the first and the second power supply lines to said earth terminal;

N input terminals for being supplied with first through N-th input signals; and an output terminal connected to said one of the first and the second power supply lines;

a different one of said first and said second power supply lines being connected to a power supply (VDD);

wherein the predetermined number of transistors in each of said first through said fourth transistor arrays is equal to N;

wherein each transistor of each transistor array of said first through said fourth transistor arrays connected to a respective one of said N input terminals so that for each of said first through fourth transistor arrays, the one of said transistors to which the respective input terminal is connected is separated from said one of the first and second power supply lines by x of the other transistors in the respective array, and wherein for each of said N input terminals the total of x for said first through fourth transistor arrays is the same.

19. A semiconductor integrated circuit arrangement as claimed in claim 18, wherein:

each transistor of said first through said fourth transistor arrays is of a p-channel MIS type;

said ground control portion comprising n-channel MIS transistors equal in number to the gate electrode lead wires of the transistors of each of said first through said fourth transistor arrays;

said n-channel MIS transistors having sources connected to said earth terminal in common;

said n-channel MIS transistors having drains connected to said one of the first and the second power supply lines in common;

said n-channel MIS transistors having gates connected to the gate electrode leads of each of said first and said second transistor arrays, respectively.

20. A semiconductor integrated circuit arrangement including first and second transistor arrays arranged in first and second device regions respectively, each of said first and second device regions having a length in a first direction, a width in a second direction perpendicular to said first direction, and each of said first and second transistor arrays having two endmost regions, one at each end of said first and said second device regions in said first direction, each of said first and said second transistor arrays comprising N predetermined number of transistors connected in series, where N is an integer greater than one, each of said transistors being of an MIS (metal insulator semiconductor) type and having a gate, wherein:

said first and said second device regions are arranged along said second direction;

said semiconductor integrated circuit arrangement comprising:

a first power supply line comprising a first lead extracted from one of the endmost regions of said first device region and a second lead extracted from one of the endmost regions of said second device region and located at a side opposite to said first lead in said first direction, said first and said second leads being electrically connected at a position between said first and said second device regions;

a second power supply line comprising a third lead extracted from the other of said endmost regions of the first device region and a fourth lead extracted from the other of said endmost regions of the second device region, said third and said fourth leads being electrically connected so as not to overlap said first power supply line;

a predetermined number of first gate electrode leads connected to the gates of the transistors of said first transistor array, respectively, and extended on said first device region between said first lead and said third lead along said second direction; and a predetermined number of second gate electrode leads connected to the gates of the transistors of said second transistor array, respectively, and extended on said second device region between said second lead and said fourth lead along said second direction;

said first lead and said third lead each connected to opposite ends along said first direction of said first transistor array;

said second lead and said fourth lead each connected to opposite ends along said first direction of said second transistor array;

the first gate electrode leads sequentially numbered one through N, along said first direction from said first lead to said third lead in said first device region, and being connected to correspondingly numbered second gate electrode leads, sequentially numbered one through N along said first direction from said fourth lead to said second lead in said second device region to form gate electrode lead wires;

said gate electrode lead wires being arranged so as not to overlap one another.

21. A semiconductor integrated circuit arrangement as claimed in claim 20, wherein said semiconductor integrated circuit further comprises:

a power supply portion connected to one of said first and said second power supply lines and having a power supply terminal connected to a power supply (VDD) for supplying a power-supply voltage from said power supply to said one of the first and the second power supply lines;

N input terminals for being supplied with first through N-th input signals; and an output terminal connected to said one of the first and the second power supply lines;

a different one of said first and said second power supply lines being connected to the ground;

wherein the predetermined number of transistors in each of said first and said second transistor arrays is equal to N;

wherein each transistor of each transistor array of said first and said second transistor arrays connected to a respective one of said N input terminals so that for each of said first and second transistor arrays, the one of said transistors to which the respective input terminal is connected is separated from said one of the first and second power supply lines by x of the other transistors in the respective array, and wherein for each of said N input terminals, the total of x for said first and second transistor arrays is the same.

22. A semiconductor integrated circuit arrangement as claimed in claim 21, wherein:

each transistor of said first and said second transistor arrays is of an n-channel MIS type and of an enhanced type;

said power supply portion comprising an n-channel MIS transistor of a depletion type;

said n-channel MIS transistor of a depletion type having a gate and a source which are connected to said one of the first and the second power supply lines in common;

said n-channel MIS transistor of a depletion type having a drain which is connected to said power supply terminal.

23. A semiconductor integrated circuit arrangement as claimed in claim 21, wherein:

each transistor of said first and said second transistor arrays is of an n-channel MIS type;

said power supply portion comprising p-channel MIS transistors equal in number to the gate electrode lead wires of the transistors of each of said first and said second transistor arrays;

said p-channel MIS transistors having sources connected to said power supply terminal in common;

said p-channel MIS transistors having drains connected to said one of the first and the second power supply lines in common;

said p-channel MIS transistors having gates connected to the gate electrode lead wires of each of said first and said second transistor arrays, respectively.

24. A semiconductor integrated circuit arrangement as claimed in claim 20, wherein said semiconductor integrated circuit further comprises:

a ground control portion connected to one of said first and said second power supply lines and having an earth terminal connected to the ground for controlling connection of said one of the first and the second power supply lines to said earth terminal;

N input terminals for being supplied with first through N-th input signals; and an output terminal connected to said one of the first and the second power supply lines;

a different one of said first and said second power supply lines being connected to a power supply (VDD);

wherein the predetermined number of transistors in each of said first and said second transistor arrays is equal to N;

wherein each transistor of each transistor array of said first and said second transistor arrays connected to a respective one of said N input terminals so that for each of said first and second transistor arrays, the one of said transistors to which the respective input terminal is connected is separated from said one of the first and second power supply lines by x of the other transistors in the respective array, and wherein for each of said N input terminals, the total of x for said first and second transistor arrays is the same.

25. A semiconductor integrated circuit arrangement as claimed in claim 24, wherein:

each transistor of said first and said second transistor arrays is of a p-channel MIS type;

said ground control portion comprising n-channel MIS transistors equal in number to the gate electrode lead wires of the transistors of each of said first and said second transistor arrays;

said n-channel MIS transistors having sources connected to said earth terminal in common;

said n-channel MIS transistors having drains connected to said one of the first and the second power supply lines in common;

said n-channel MIS transistors having gates connected to the gate electrode lead wires of each of said first and said second transistor arrays, respectively.

26. A logic circuit comprising:

N input terminals (N is an integer>1);

first and second power lines; and a logic unit comprising four transistor arrays, each of said arrays consisting of N transistors connected in series between said power lines, each of said input terminals being connected to one of said transistors in each of said transistor arrays, wherein for each of said arrays, the one of said transistors to which the respective input terminal is connected is separated from said first power line by $x_m$ of the other transistors in the respective array, and wherein for each of said input terminals, $\Sigma x_m = 2N-2$, for m=1, . . . , 4.

27. The circuit of claim 26, wherein said first power line has a higher potential than said second power line.

28. The circuit of claim 26, wherein said second power line has a higher potential than said first power line.

29. The circuit of claim 26, wherein said transistors are metal insulator semiconductor transistors.

30. A logic circuit comprising:

N input terminals (N is an integer>2);

first and second power lines; and a logic unit comprising two transistor arrays, each of said arrays consisting of N transistors connected in series between said power lines, each of said input terminals being connected to a gate of one of said transistors in each of said transistor arrays, wherein for each of said arrays the one of said transistors to which the respective input terminal is connected is separated from said first power line by $x_m$ of the other transistors in the respective array, and wherein for each of said input terminals, $\Sigma x_m = N-1$, for m=1, 2.

31. The circuit of claim 30, wherein said first power line has a higher potential than said second power line.

32. The circuit of claim 30, wherein said second power line has a higher potential than said first power line.

33. The circuit of claim 30, wherein said transistors are metal insulator semiconductor transistors.

* * * * *